(12) United States Patent
Dempsey et al.

(10) Patent No.: US 9,404,983 B2
(45) Date of Patent: Aug. 2, 2016

(54) RADIO FREQUENCY TRANSMIT COIL FOR MAGNETIC RESONANCE IMAGING SYSTEM

(71) Applicant: ViewRay, Incorporated, Oakwood Village, OH (US)

(72) Inventors: James F. Dempsey, Chagrin Falls, OH (US); Thomas Chmielewski, Aurora, OH (US)

(73) Assignee: ViewRay, Incorporated, Oakwood Village, OH (US)

( * ) Notice: Subject to any disclaimer, the term of this patent is extended or adjusted under 35 U.S.C. 154(b) by 700 days.

(21) Appl. No.: 13/796,784

(22) Filed: Mar. 12, 2013

(65) Prior Publication Data

US 2014/0266206 A1   Sep. 18, 2014

(51) Int. Cl.
*G01R 33/34* (2006.01)
*G01R 33/48* (2006.01)

(52) U.S. Cl.
CPC ........ *G01R 33/34092* (2013.01); *G01R 33/481* (2013.01); *G01R 33/4808* (2013.01); *G01R 33/4812* (2013.01)

(58) Field of Classification Search
CPC ............. G01R 33/481; G01R 33/4812; G01R 33/4808; G01R 33/34092
See application file for complete search history.

(56) References Cited

U.S. PATENT DOCUMENTS

| 4,680,548 | A | | 7/1987 | Edelstein et al. | |
|---|---|---|---|---|---|
| 5,990,681 | A | * | 11/1999 | Richard | G01R 33/34046 324/318 |
| 6,100,694 | A | * | 8/2000 | Wong | G01R 33/34046 324/318 |
| 7,907,987 | B2 | | 3/2011 | Dempsey | |
| 8,022,705 | B2 | * | 9/2011 | Bogdanov | G01R 33/34046 324/318 |
| 8,129,992 | B2 | * | 3/2012 | Cork | G01R 33/3415 324/318 |
| 8,427,158 | B2 | * | 4/2013 | Huish | G01R 33/34007 324/318 |
| 8,497,682 | B2 | * | 7/2013 | Huish | G01R 33/34007 324/318 |
| 2006/0033497 | A1 | | 2/2006 | Chmielewski et al. | |
| 2008/0088309 | A1 | | 4/2008 | Eberler et al. | |

(Continued)

FOREIGN PATENT DOCUMENTS

| EP | 2345906 A1 | 7/2011 |
|---|---|---|
| EP | 2523011 A1 | 11/2012 |
| GB | 2424281 A | 9/2006 |
| WO | WO-2008/122899 A1 | 10/2008 |

(Continued)

OTHER PUBLICATIONS

International Search Report issued in corresponding international application No. PCT/US2014/024354 mailed Jun. 12, 2014.

*Primary Examiner* — Dixomara Vargas
(74) *Attorney, Agent, or Firm* — Mintz Levin Cohn Ferris Glovsky and Popeo, P.C.

(57) ABSTRACT

A radio frequency coil is disclosed that is suitable for use with a magnetic resonance imaging apparatus. The radio frequency coil comprises first and second conductive loops connected electrically to each other by a plurality of conductive rungs. The conductive rungs each include a section that is relatively thin that will result in less attenuation to a radiation beam than other thicker sections of the rungs. Insulating regions are also disposed in areas of the radio frequency coil that are bound by adjacent rungs and the conductive loops. Portions of the insulating regions can be configured to provide a substantially similar amount of attenuation to the radiation beam as the relatively thin sections of the conductive rungs.

26 Claims, 6 Drawing Sheets

(56) References Cited

U.S. PATENT DOCUMENTS

2009/0134875 A1 5/2009 Tomiha et al.
2011/0043207 A1 2/2011 Gross et al.

FOREIGN PATENT DOCUMENTS

| WO | WO-2009/013650 A2 | 1/2009 |
| WO | WO-2011/063342 A1 | 5/2011 |

* cited by examiner

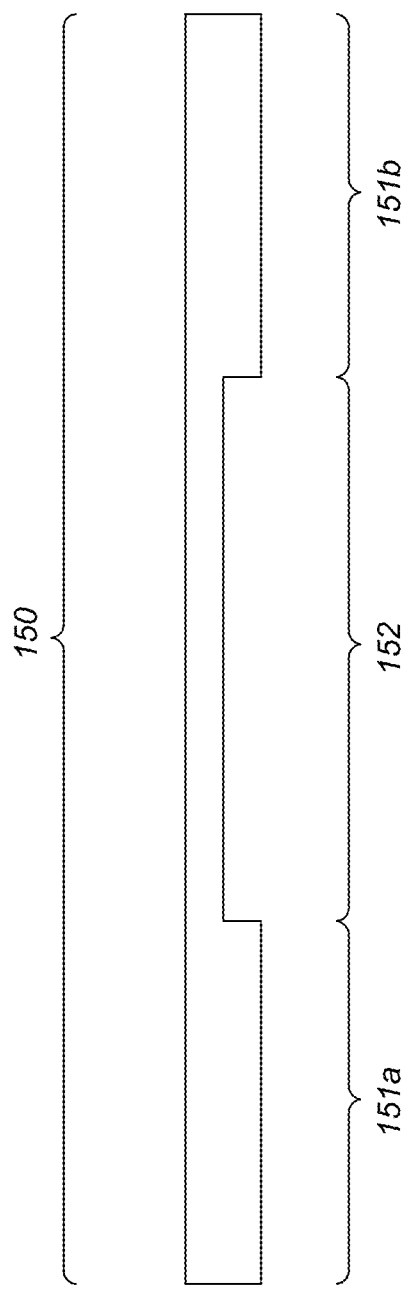

RADIO FREQUENCY TRANSMIT COIL FOR MAGNETIC RESONANCE IMAGING SYSTEM

TECHNICAL FIELD

The present disclosure relates generally to radio frequency (RF) coils for use in a magnetic resonance imaging (MRI) system, including RF coils suitable for use with MRI guided radiation therapy systems.

BACKGROUND

Generally, in an MRI system, a substantially uniform main magnetic field, $B_0$, is created to cover the entire region of the subject being imaged. The main magnetic field aligns magnetic dipoles of protons within the main magnetic field. Thereafter, a transient RF pulse is introduced that causes the proton dipoles to temporarily flip. Once the RF energy from the RF pulse is removed, the dipoles flip back to their relaxed state and release the energy absorbed from the RF pulse in the form of a photon having some predictable radio frequency. The photons are captured and processed to enable imaging.

Generally, the transient RF pulse is transmitted by an RF coil. One type of RF coil commonly used in MRI is known as the "birdcage coil." For example, respective examples of birdcage coils are disclosed by U.S. Pat. No. 4,680,548 to Edelstein et al., titled "Radio Frequency Field Coil For NMR," the entire content of which is incorporated herein by reference, and U.S. Patent Application Publication 2006/0033497 to Chmielewski et al., titled "Degenerate Birdcage Coil and Transmit/Receive Apparatus and Method For Same," the entire content of which is incorporated herein by reference. Typically, a birdcage coil is cylindrical in shape and includes two conductive end loops or rings interconnected by an even number of rungs or axial conductors that divide the two end rings into arcs or segments defined therebetween. This construction gives this type of RF coil the appearance of a birdcage, and hence the name "birdcage coil."

Notwithstanding the birdcage coils discussed above, there remains a desire for further improvements. In particular, when MRI technology is applied to the field of radiotherapy, traditional birdcage coils are not ideally suited for accommodating a radiotherapy system. U.S. Pat. No. 7,907,987 to Dempsey, titled "System for delivering conformal radiation therapy while simultaneously imaging soft tissue," the entire content of which is incorporated herein by reference, discloses an example of such an MRI guided radiotherapy system.

SUMMARY

Disclosed herein are systems and methods for radio frequency coils for use in a magnetic resonance imaging (MRI) system, including RF coils suitable for use with MRI guided radiation therapy systems, some embodiments of which may include a first conductive loop, a second conductive loop and a conductive rung between the first and second conductive loops that may be electrically connected to the first and second conductive loops, wherein the conductive rung may include first and second conductive rung sections and wherein the second conductive rung section may have a thickness substantially thinner than at least one of a thickness of the first conductive loop, a thickness of the second conductive loop, and a thickness of the first conductive rung section.

In some embodiments, the second conductive rung section may have a thickness that is about 5% to about 75% of the thickness of the at least one of the first conductive loop, the second conductive loop, and the first conductive rung section. In other embodiments, the second conductive rung section may have a thickness that is about 10% to about 50% of the thickness of the at least one of the first conductive loop, the second conductive loop, and the first conductive rung section. In still further embodiments, the second conductive rung section may have a thickness that is about 15% to about 30% of the thickness of the at least one of the first conductive loop, the second conductive loop, and the first conductive rung section. The second conductive rung may also have a section has a thickness that is about 20% of the thickness of the at least one of the first conductive loop, the second conductive loop, and the first conductive rung section.

In certain embodiments, the conductive rung may further include a third conductive rung section, the second conductive rung section being disposed between the first and third conductive rung sections and where the second conductive rung section may be substantially thinner than the first and third conductive rung sections. In some embodiments, at least one of the first conductive loop, the second conductive loop, and the conductive rung may include at least one of copper, silver, and aluminum or may include multiple layers of conductive materials.

In some embodiments, the radiofrequency coil may include a plurality of conductive rungs electrically connected to the first and second conductive loops. It may also include an insulating region disposed between adjacent conductive rungs and between the first and second conductive loops and at least a portion of the insulating region may have a thickness selected so that the portion of the insulating region and the second conductive rung section both provide substantially the same amount of attenuation to a radiation beam. In some embodiments, the insulating region may be a polyimide.

In further embodiments the radio frequency coils may also include a printed circuit board (PCB) substrate and the conductive rung may include a layer of conductive material formed on a first side of the PCB substrate. The coil may also include an insulating region disposed adjacent to the conductive rung and between the first and second conductive loops, where the insulating region may include a first insulating layer formed on the first side of the PCB substrate and a second insulating layer formed on a second side of the PCB substrate.

The radio frequency coil may also include PIN diode circuitry located adjacent the first and third conductive rung sections, and the magnetic resonance imaging apparatus may have a field strength less than 1.0 T.

These and other features, aspects, and advantages of the present disclosure will become better understood with reference to the following description and claims.

BRIEF DESCRIPTION OF THE DRAWINGS

Features, aspects, and embodiments are described in conjunction with the attached drawings, in which:

FIG. 4 shows a side view of an embodiment of a conductive rung that can be used with the RF coil shown in FIGS. 3A and 3B.

DETAILED DESCRIPTION

The following description illustrates embodiments by way of example and not by way of limitation. All numbers disclosed herein are approximate values unless stated otherwise, regardless whether the word "about" or "approximately" is used in connection therewith. Whenever a numerical range with a lower limit and an upper limit is disclosed, any number falling within the range is specifically and expressly disclosed.

Figure 1:
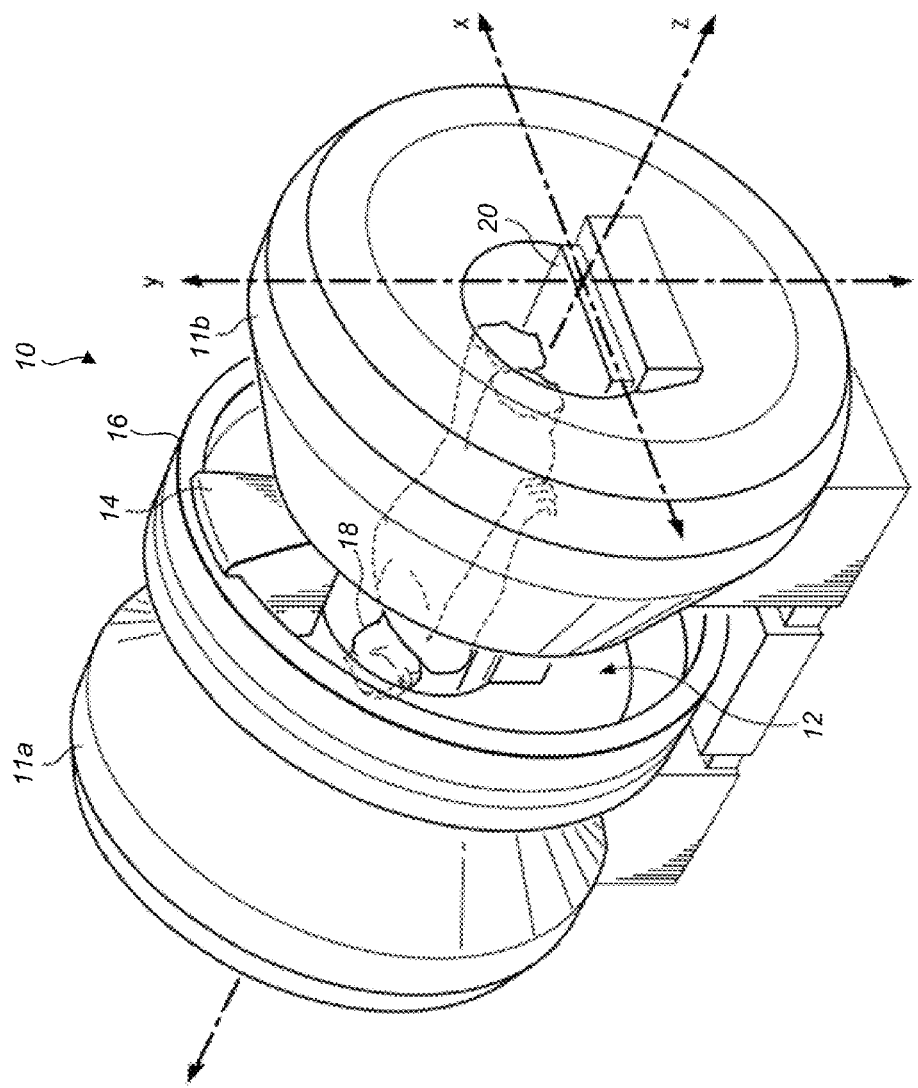
FIG. 1 shows a perspective view of an MRI system.

The RF coil assembly concepts of the present disclosure may be used with any type of magnetic resonance imaging (MRI) system. It is particularly well suited for use with a split solenoid or horizontal "open" MRI that includes a gap between two horizontal MRI magnet halves. The RF coil assemblies disclosed herein are further well suited for use with a horizontal open MRI that is used with an additional instrument being operated within its gap. FIG. 1 depicts such an arrangement with a horizontal open MRI 10 having first and second main magnet housings 11a and 11b separated by a gap region 12. An instrument 14 is mounted in the gap region 12 on a gantry 16. Also depicted are a patient 18 and patient couch 20. In some embodiments, the gantry 16 can be used to reposition the instrument 14 about the patient 18 (i.e., about the Z-axis shown in FIG. 1).

The embodiment of FIG. 1 can include elements of a system of the assignee of the current application, ViewRay, Incorporated, described in part in U.S. Pat. No. 7,907,987 to Dempsey, titled "System for Delivering Conformal Radiation Therapy while Simultaneously Imaging Soft Tissue" (hereafter "Dempsey '987"), which is hereby incorporated by reference. For example, the instrument 14 can comprise a radiation therapy device and associated multi-leaf collimator (MLC), which, in combination with a fast-imaging horizontal open MRI, allows for improved radiation therapy that can account for a target's location during radiation treatment, as discussed in Dempsey '987. While only a single assembly is shown as the instrument 14 in FIG. 1, some embodiments can include multiple assemblies associated with instrument 14, e.g., multiple radiation emitters and/or MLC devices. For example, some embodiments may include three radiation head assemblies (not shown in FIG. 1) mounted in gap 12, distributed about the Z-axis, and rotatable about the Z-axis on the gantry 16. While some aspects of the embodiments disclosed herein are described with respect to the system disclosed by Dempsey '987, such aspects are not required for use with the disclosed RF coil assembly. It is contemplated that the RF coil assembly disclosed herein may be used in any type of MRI, with or without the use of an associated instrument 14. Furthermore, for systems utilizing an instrument 14, such instruments are not limited to radiation therapy devices such as radiation sources or linear particle accelerators (LINACs), but can include any type of instrument used with an MRI.

Figure 2:
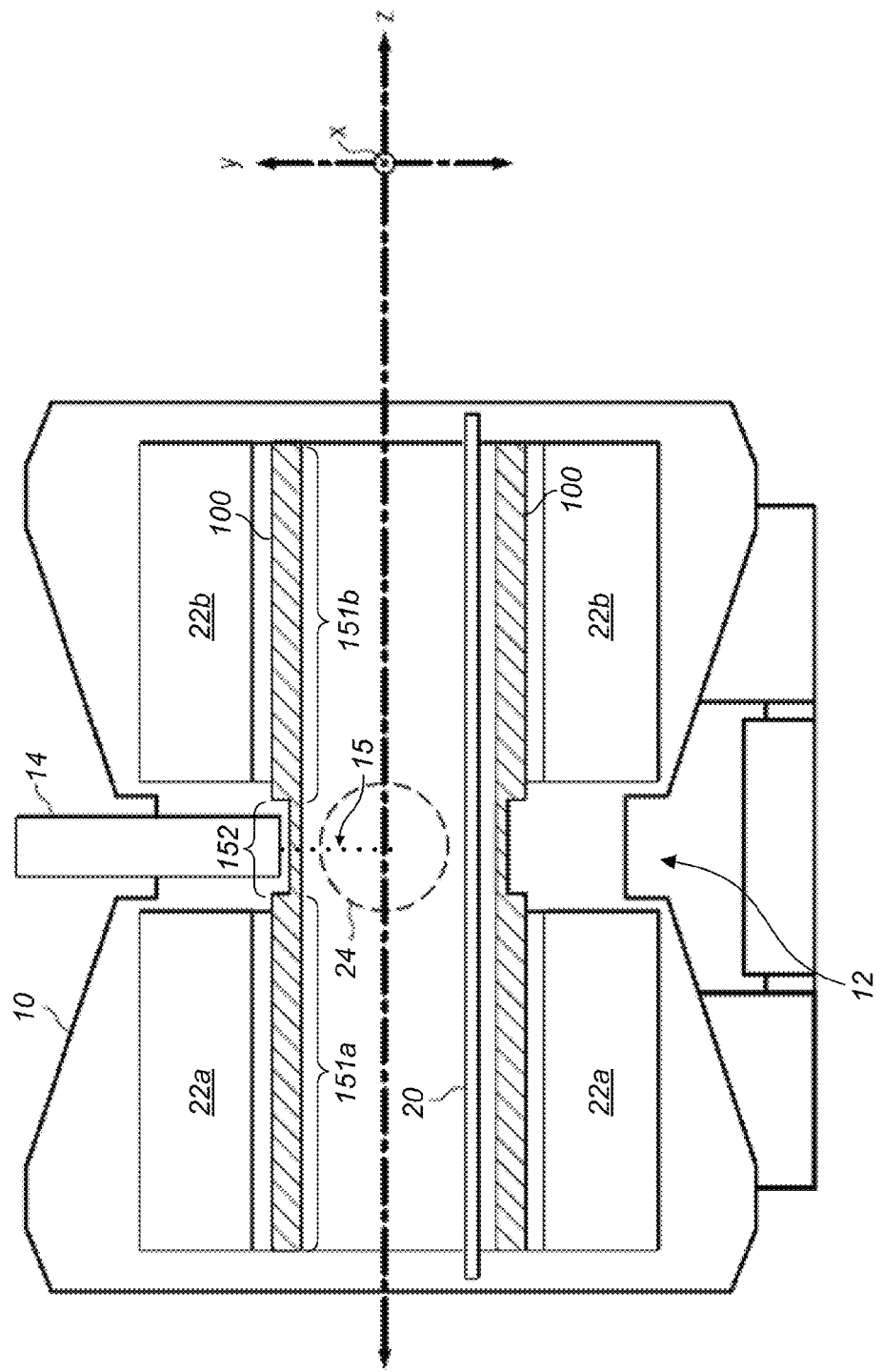
FIG. 2 shows a simplified cross-sectional view of the MRI system shown in FIG. 1.

FIG. 2 is diagrammatic cross-section of the system shown in FIG. 1. The embodiment of FIG. 2 depicts the horizontal open MRI 10 including a pair of main magnets 22a and 22b, separated by the gap 12. The MRI 10 can be used to image a region of interest 24 above the patient couch 20, while the instrument 14 can be used to emit radiation 15 for simultaneously performing some form of treatment to the patient within the region of interest 24. The MRI 10 also includes an RF transmit coil assembly 100 that extends across the gap 12. Embodiments of the RF coil assembly 100 are described in greater detail below. The MRI 10 can include additional conventional components not shown, for example, gradient coils and potentially one or more shim coils. The coordinate system used in the figures and throughout this disclosure refers to the longitudinal axis through the MRI bore as the Z-axis. The X-axis extends perpendicular to the Z-axis and from side to side of the MRI 10; the Y-axis extends perpendicular to the Z-axis and from the bottom to the top of MRI 10.

As shown in FIG. 2, the RF coil assembly 100 extends between the instrument 14 and the region of interest 24. So, for example, in embodiments where the instrument 14 comprises a radiation emitting device such as those used with a radiation therapy system, a portion of the RF coil assembly will be in the path of radiation 15 that is being directed from the instrument 14 towards the patient at the region of interest 24. Simply inserting a conventional RF coil assembly in such a position poses problems, both for MRI operation and for operation of the radiation therapy device as well as for other systems that could be implemented as the instrument 14. For example, a conventional RF transmit coil includes structure that would interfere with a radiation therapy beam passing therethrough from the instrument 14, potentially attenuating the beam to the point where the RF coil degrades the quality of the treatment to the point of it being clinically unacceptable. Thus, an RF coil is disclosed herein that allows for proper MRI imaging without interfering with the operation of an instrument 14. For example, embodiments of the RF coil disclosed herein can allow for proper MRI imaging without causing an undesirable level of attenuation to a radiation beam being emitted from instrument 14 through a portion of the RF coil.

Figure 3A:
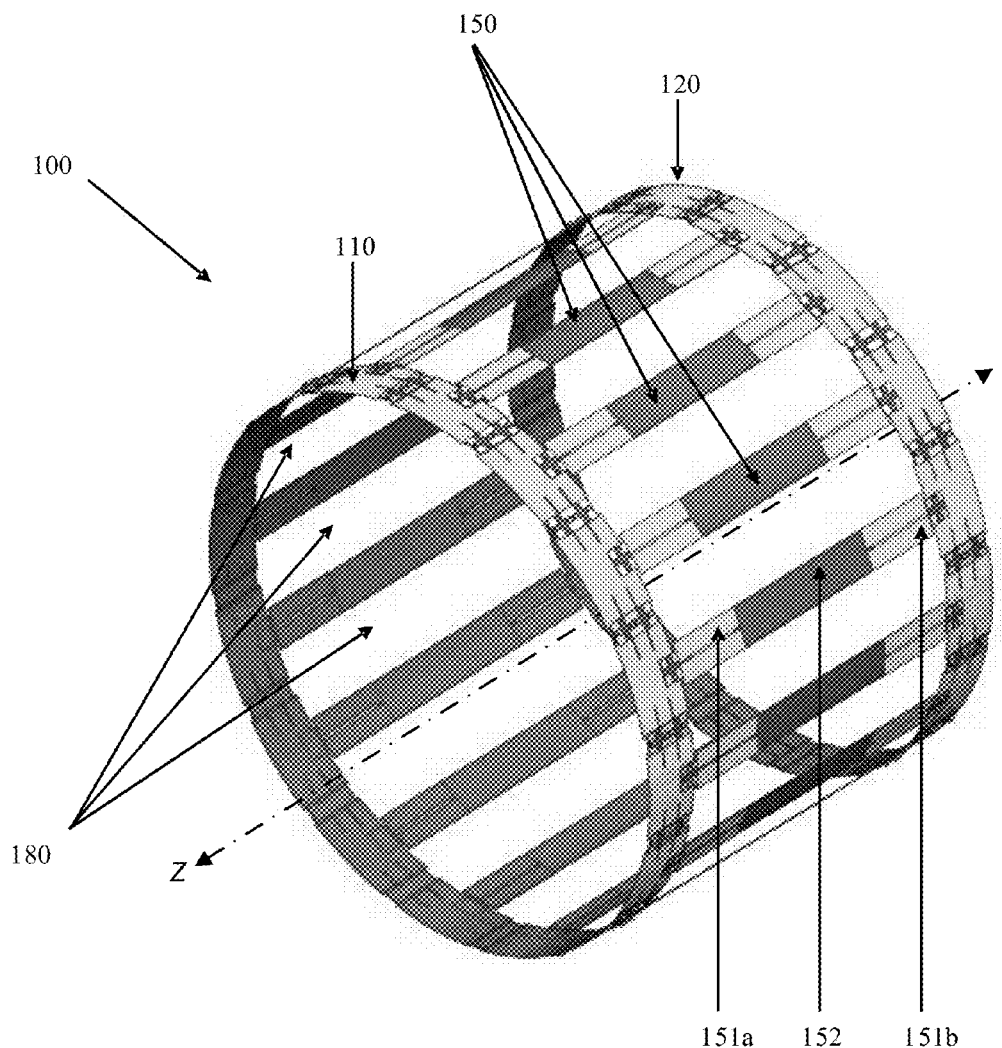
FIG. 3A shows a perspective view of an RF coil according to the present disclosure.
Figure 3B:
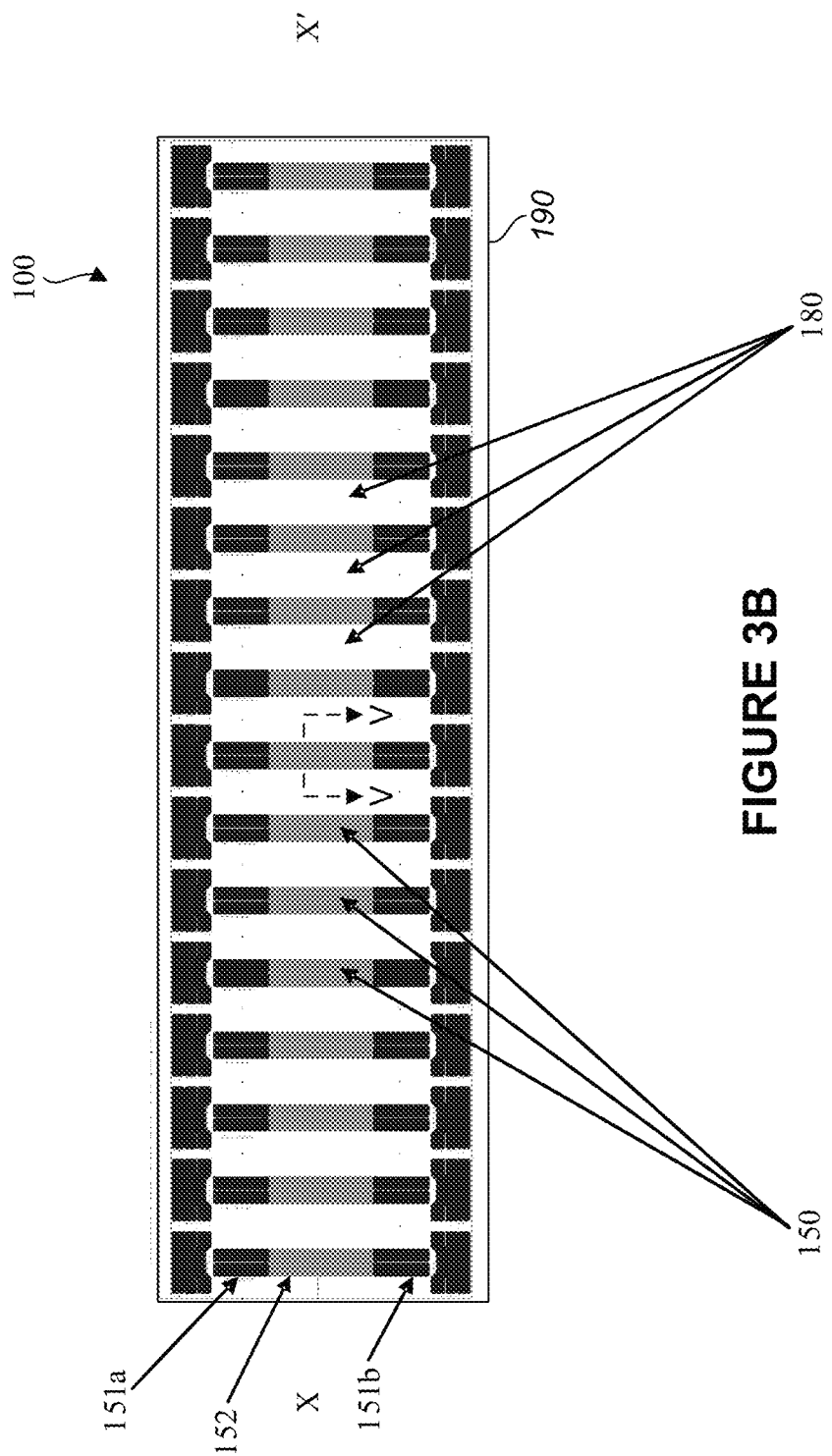
FIG. 3B shows a plan view of the RF coil shown in FIG. 3A where the RF coil is unrolled.

FIG. 3A shows an embodiment of such an RF coil, which is designated as RF coil 100. FIG. 3B shows a plan view of RF coil 100 opened and laid flat, i.e., on a planar surface. FIG. 3A shows the configuration of RF coil 100 as installed in MRI system 10. When installed, the RF coil 100 can define an inner space having a generally cylindrical shape, the length of which extends parallel to the Z axis of the MRI system 10 as shown in FIG. 3A.

The RF coil 100 comprises a first conductive loop 110 and a second conductive loop 120, both of which are coaxial with the Z-axis. The first and second conductive loops 110 and 120 are electrically connected to each other via a plurality of conductive rungs 150, each of which extend at least somewhat parallel to the Z-axis between the first and second conductive loops 110 and 120.

Although the RF coil 100 is shown in FIGS. 3A and 3B as having sixteen conductive rungs 150, alternative embodiments of the RF coil 100 can have other numbers of rungs. For example, exemplary embodiments of the RF coil 100 can include numbers of conductive rungs 150 equal to any multiple of four. However, embodiments that include fewer than sixteen conductive rungs 150 may have less than desirable RF emission uniformity.

Each of the plurality of conductive rungs 150 comprises a first end section 151a, a middle section 152, and a second end section 151b, disposed in series with each other between the first conductive loop 110 and the second conductive loop 120. The first end section 151a is electrically connected to the first conductive loop 110. The second end section 151b is electrically connected to the second conductive loop 120. The middle section 152 is electrically connected to the first end section 151a and to the second end section 151b. Thus, an electrical current can flow between the first conductive loop 110 and the second conductive loop 120 through the first end section 151a, the middle section 152, and the second end section 151b of the conductive rung 150.

Insulating regions 180 are defined by respective pairs of adjacent rungs 150 and the first and second conductive loops 110 and 120. The insulating regions 180 may comprise electrically insulating materials as discussed in more detail below.

In one embodiment of the disclosed systems, PIN diode decoupling circuitry is located outside the path of the radiation beam, adjacent first end section 151a and second end section 151b. This embodiment is especially effective in conjunction with low field MRI (for example, less than a 1.0 T field strength). In one implementation, a coax cable is used to provide the off-center location of the PIN diode decoupling. Similar more efficient methods can also be implemented such as utilizing twisted pairs or wide parallel conductors with self-canceling field profiles. The tuning capacitors may be placed in the rung and ring gaps outside of the radiation beam, and may be reduced to compensate for increased inductance due to the conductor length change.

FIG. 4 shows a block diagram illustrating a generalized side view of conductive portions of an exemplary conductive rung 150. Note that FIG. 4 does not show insulating portions of the conductive rung 150 so that the conductive regions of the conductive rung 150 can be more clearly illustrated. Also, the diagram shown in FIG. 4 is not necessarily drawn to scale, and is not intended to be limiting as to the exact shapes of the conductive regions of the conductive rung 150. Rather, FIG. 4 is merely provided to illustrate how the conductive rung 150 can include relatively thinner and thicker conductive portions. Thus, as shown in FIG. 4, the conductive rungs 150 include a relatively thin conducting portion, i.e., at least some conductive portion of each conductive rung 150 can have a thickness that is substantially thinner than a thickness (or thicknesses) of other conductive portions of the conductive rung 150. More specifically, the middle section 152 includes a conductive portion that is substantially thinner than conductive portions of the first and second end sections 151a and 151b. Also, in such embodiments, the conductive portion of the middle section 152 can be substantially thinner than conductive portions of the first and second conductive loops 110 and 120.

The conductive portion of the middle section 152 can have a thickness that is about 5% to about 75% of the thickness of the conductive portions of the first and second end sections 151a and 151b. In some embodiments, the conductive portion of the middle section 152 can have a thickness that is about 10% to about 50% of the thickness of conductive portions of the first and second end sections 151a and 151b. In some embodiments, the conductive portion of the middle section 152 can have a thickness that is about 15% to about 30% of the thickness of conductive portions of the first and second end sections 151a and 151b. In some embodiments, the conductive portion of the middle section 152 can have a thickness that is about 20% of the thickness of conductive portions of the first and second end sections 151a and 151b.

The conductive portions of the first conductive loop 110, the second conductive loop 120, and the plurality of conductive rungs 150 can comprise one or more of many different conductive materials known to be suitable for the construction of MRI RF coils. For example, conductive portions of the conductive loops 110 and 120 and the conductive rungs 150 can comprise one or more of copper, silver, and/or aluminum. Also, in some embodiments, one or more of the first conductive loop 110, the second conductive loop 120, and the conductive rungs 150 can be formed of laminated layers, which can include one or more layers of conductive materials, such as copper, silver, and/or aluminum.

Some embodiments can include conductive portions having a thickness that yields minimal loss. For example, a desirable thickness of copper that would yield minimal loss is about 10 skin depths, where a skin depth can be calculated according to the following expression:

$$\text{Skin Depth} = \delta_S = \sqrt{\frac{2\rho}{2\pi f \mu_0 \mu_R}}$$

where
ρ=bulk resitivity (ohm–meters)
f=frequency (Hertz)
$\mu_0$=permeability constant (Henries|meter)=$4\pi \times 10^{-7}$
$\mu_y$=relative permeability (usually ~1)

Thus, for example, at 14.7 MHz, with copper being the conductive material, 10 skin depths would be approximately equal to 0.172 mm. However, a layer of copper having a thickness of 0.172 mm would cause an amount of attenuation to radiation beam 15 that is approximately equivalent to about 1.53 mm of water (Calculation: 0.172 mm*8.9 (density of copper/density of water)=1.53 mm), which is an undesirable amount of attenuation. But by reducing the copper thickness in path of the radiation beam 15 by a significant factor, the attenuation can be reduced to a satisfactory level. For example, if the thickness of the copper in the path of radiation beam 15 is reduced by a factor of five, the attenuation caused by the copper can be reduced to an amount approximately equivalent to about 0.3 mm of water (Calculation: 0.03302 mm*8.9=0.3 mm).

Thus, referring back to FIG. 2, preferably the relatively thinner middle section 152 is provided in the path of radiation 15 emitted from the instrument 14 during operation. One advantage of constructing the middle sections 152 of the rungs 150 to have a relatively thinner conductor is that the thinner conductor causes less attenuation to the radiation 15 than a thicker conductor, such as the thicker conductors used to form the first and second end sections 151a and 151b. The radiation 15 can thus penetrate the middle section 152 of the RF coil 100, reach the patient 18, and still be suitable for exerting the desired level of radiation therapy on the region of interest 24 of the patient 18.

As will be appreciated by those skilled in the art, reducing the thickness of the conductive portions of the rungs of a conventional birdcage-style RF coil has the effect of raising the RF resistance of the rungs. An important performance factor of RF coils is the quality factor (Q-factor) of the coil, which should be maximized. For a birdcage-style RF coil, the Q-factor is inversely proportional to the RF resistance of the coil. Thus, thinning the rungs of a conventional RF coil in order to avoid attenuating a radiation beam 15 has the undesirable effect of increasing the RF resistance of the coil and therefore reducing the Q-factor of the coil.

The present disclosure provides a solution to this problem by providing rungs 150 that are only partially thinned. The RF coil described herein includes the relatively thin middle sections 152 in combination with relatively thick rung end sections 151a and 151b and conductive loops 110 and 120. Aspects of the present disclosure are based on an observation that the amount of RF current in the conductive loops 110 and 120 will be significantly higher than the amount of RF current in each of the rungs 150. For example, the amount of RF current in the conductive loops 110 and 120 may be four to five times higher than the amount of RF current in each of the rungs 150. Therefore, the increased RF resistance caused by thinning portions of the rungs 150 can be significantly compensated for by reducing the RF resistance of the conductive loops 110 and 120, as well as by reducing the RF resistance of significant portions of the rungs 150 (i.e., the rung end sections 151a and 151b). The result is an acceptably small amount of degradation to the Q-factor or performance of the RF coil 100.

Referring again to FIG. 3B, in some embodiments, the RF coil 100 can be constructed using the thin printed circuit board (PCB) technology. In such embodiments, multiple thicknesses of conductive layers can be applied to one or both sides of a PCB 190 (not shown in FIG. 3A for clarity purposes). For embodiments where conductive layers are applied to both sides of PCB 190, vias can be used to electrically connect the conductive layers that are located on opposing sides of the PCB 190. In some embodiments, for example, the conductive portions of the middle sections 152 of the rungs 150 can be located on one side (top) of the PCB 190, and the end sections 151a and 151b, the first end loop 110, and the second end loop 120 can all be located on the other side (bottom) of the PCB 190. In such embodiments, vias can be used to electrically connect the middle sections 152 to adjacent end sections 151a and 151b through the PCB 190.

The RF coil 100 can be configured as a band-pass, low-pass, or high-pass coil, for example by including circuit elements, such as capacitors, in the rungs 150 and/or insulating regions 180 according to known coil design and tuning methods. Also, slots in the conductive layers can be provided for reducing eddy currents.

While the RF coil 100 has been described as being constructed using PCB technology, alternative embodiments of the RF coil 100 can include alternative methods of construction that do not involve PCB technology. For example, thin strips of conductive material can be applied to a former made of insulating material in order to construct the middle sections 152 of the rungs 150. The end loops 110 and 120, as well as the end sections 151a and 151b of the rungs 150, can be constructed of thicker conductive materials, layers, or groups of layers, that can be soldered or otherwise connected to the thin conductive strips of the middle sections 152 of the rungs 150. In some embodiments, desired thicknesses of the conductive materials can be achieved by selectively thickening the conductive materials using known plating processes or other known construction techniques.

The thickness of the insulating regions 180 can also vary, for example in order to allow for uniform attenuation of radiation beam 15. The insulating regions 180 can be formed of single or multiple layers of insulating materials, which can include one or more different insulating materials, such as polyimide film (e.g., KAPTON® polyimide film, available from DuPont, Wilmington, Del.).

Figure 5:
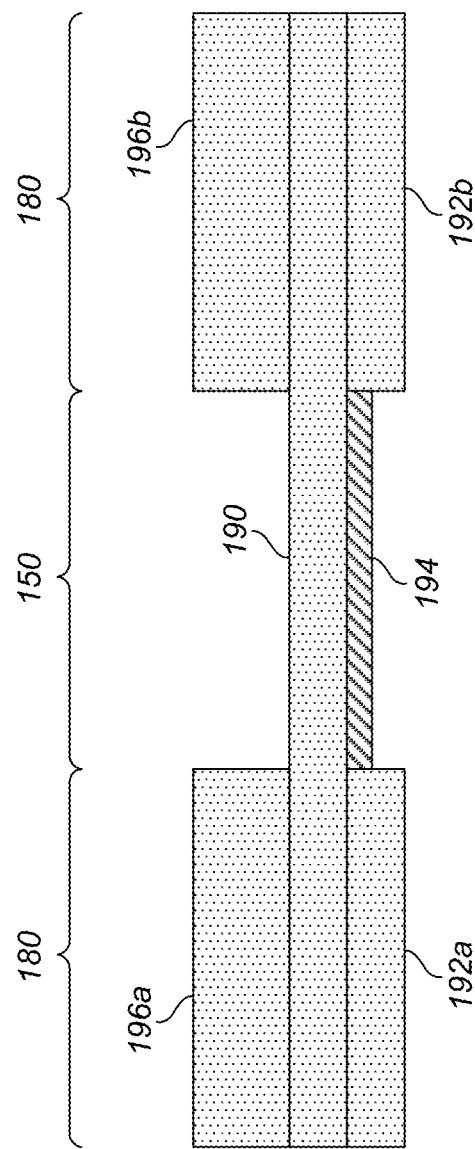
FIG. 5 shows a cross-sectional view of a portion of the RF coil taken along section line V-V in FIG. 3B.

FIG. 5 shows an exemplary cross-sectional view taken along section lines V-V shown in FIG. 3B. The section shown in FIG. 5 illustrates portions of the RF coil 100 that could be positioned in the path of the radiation beam 15 depending on the position of the instrument 14 relative to the RF coil 100. As shown in FIG. 5, the RF coil 100 includes a non-conductive (insulating) PCB substrate 190 having a thickness T1. Insulating layers 192a and 192b having a thickness T2 are formed on the PCB substrate 190 in the insulating regions 180. A conducting layer 194 having a thickness T3 is formed on the PCB substrate 190 in the rung 150 region. Also, additional insulating layers 196a and 196b having a thickness T4 are formed on an opposing side of the PCB substrate 190 in the insulating regions 180. Because the material of conductive layer 194 causes greater radiation attenuation than the substrate and insulating materials, the total thickness T1+T2+T3 of the substrate 190 and insulating layers 192 and 196 can be greater than the thickness T1+T3 of the substrate 190 and conductive layer 194 in order to provide for uniform attenuation to the radiation beam 15. For example, in some embodiments, the PCB substrate 190 can have a thickness T1=0.0762 mm, the insulating layers 192a and 192b can each have a thickness T2=0.0762 mm, the conducting layer 194 can have a thickness T3=0.03302 mm, and the insulating layers 196a and 196b can each have a thickness T4=0.127 mm. In such embodiments, the PCB substrate 190, and the insulating layers 192 and 196 can be formed of KAPTON® polyimide film, and the conducting layer 194 can be formed of copper. Other materials not shown in FIG. 5 that may be included in an RF coil 100, such as adhesives that may be used for securing the layers 192, 194, and 196 to the substrate 190, can be taken into consideration when determining appropriate thicknesses of the layers 192 and 196 for providing substantially the same attenuation as the conducting layer 194.

While each of the layers 192, 194, and 196 is shown as a single layer, alternatively the blocks 192, 194, and/or 196 can be formed of one or more actual layers of material. Also, one or more of the layers 192, 194, and/or 196 can include one or more different materials.

Although the illustrative embodiments of the present disclosure have been described herein with reference to the accompanying drawings and examples, it is to be understood that the disclosure is not limited to those precise embodiments, and various other changes and modifications may be affected therein by one skilled in the art without departing from the scope of spirit of the disclosure. All such changes and modifications are intended to be included within the scope of the disclosure as defined by the appended claims.

What is claimed is:

1. A radio frequency coil for use with a magnetic resonance imaging apparatus, the radio frequency coil comprising:
a first conductive loop;
a second conductive loop; and
at least one conductive rung disposed between the first and second conductive loops and electrically connected to the first and second conductive loops, forming a cylindrical volume shape,
wherein the at least one conductive rung includes a first conductive rung section and a second conductive rung section, and
wherein the second conductive rung section has a thickness that is substantially thinner than at least one of a thickness of the first conductive loop, a thickness of the second conductive loop, and a thickness of the first conductive rung section, the second conductive rung section configured to receive a radiation beam emitted from a radiation therapy device penetrating from outside the cylindrical volume into the cylindrical volume.

2. The radio frequency coil of claim 1, wherein the second conductive rung section has a thickness that is about 5% to about 75% of the thickness of the at least one of the first conductive loop, the second conductive loop, and the first conductive rung section.

3. The radio frequency coil of claim 2, wherein the second conductive rung section has a thickness that is about 10% to about 50% of the thickness of the at least one of the first conductive loop, the second conductive loop, and the first conductive rung section.

4. The radio frequency coil of claim 3, wherein the second conductive rung section has a thickness that is about 15% to about 30% of the thickness of the at least one of the first conductive loop, the second conductive loop, and the first conductive rung section.

5. The radio frequency coil of claim 4, wherein the second conductive rung section has a thickness that is about 20% of the thickness of the at least one of the first conductive loop, the second conductive loop, and the first conductive rung section.

6. The radio frequency coil of claim 1, wherein the at least one conductive rung further includes a third conductive rung section, the second conductive rung section being disposed between the first and third conductive rung sections.

7. The radio frequency coil of claim 6, wherein the second conductive rung section is substantially thinner than the first and third conductive rung sections.

8. The radio frequency coil of claim 6, further comprising PIN diode circuitry located adjacent the first and third conductive rung sections.

9. The radio frequency coil of claim 8, wherein the magnetic resonance imaging apparatus has a field strength less than 1.0T.

10. The radio frequency coil of claim 1, wherein at least one of the first conductive loop, the second conductive loop, and the at least one conductive rung includes at least one of copper, silver, and aluminum.

11. The radio frequency coil of claim 1, wherein at least one of the first conductive loop, the second conductive loop, and the at least one conductive rung includes multiple layers of conductive materials.

12. The radio frequency coil of claim 1, further comprising an insulating region disposed between adjacent conductive rungs and between the first and second conductive loops.

13. The radio frequency coil of claim 12, wherein at least a portion of the insulating region has a thickness that is selected such that the portion of the insulating region and the second conductive rung section both provide substantially the same amount of attenuation to a radiation beam.

14. The radio frequency coil of claim 12, wherein the insulating region comprises polyimide.

15. The radio frequency coil of claim 1, further comprising a printed circuit board (PCB) substrate,
wherein the at least one conductive rung includes a layer of conductive material formed on a first side of the PCB substrate.

16. The radio frequency coil of claim 15, further comprising an insulating region disposed adjacent to the at least one conductive rung and between the first and second conductive loops,
wherein the insulating region comprises a first insulating layer formed on the first side of the PCB substrate and a second insulating layer formed on a second side of the PCB substrate.

17. A radio frequency coil for use with a magnetic resonance imaging apparatus, the radio frequency coil comprising:
a first conductive loop;
a second conductive loop; and
at least one conductive rung disposed between the first and second conductive loops and electrically connected to the first and second conductive loops,
wherein the at least one conductive rung includes a first conductive rung section, a second conductive rung section, and a third conductive rung section, the second conductive rung section being disposed between the first and third conductive rung sections, and
wherein the second conductive rung section has a thickness substantially less than a thickness of the first conductive rung section and a thickness of the third conductive rung section.

18. The radio frequency coil of claim 17, wherein the thickness of the second conductive rung section is about 20% of the thickness of the at least one of the first conductive loop, the second conductive loop, and the first conductive rung section.

19. The radio frequency coil of claim 17, wherein at least one of the first conductive loop, the second conductive loop, and the at least one conductive rung includes at least one of copper, silver, and aluminum.

20. The radio frequency coil of claim 17, wherein at least one of the first conductive loop, the second conductive loop, and the rung includes multiple layers of conductive materials.

21. The radio frequency coil of claim 17, further comprising an insulating region disposed between adjacent conductive rungs and between the first and second conductive loops.

22. The radio frequency coil of claim 21, wherein at least a portion of the insulating region has a thickness that is selected such that the portion of the insulating region and the second conductive rung section both provide substantially the same amount of attenuation to a radiation beam.

23. The radio frequency coil of claim 21, wherein the insulating region comprises polyimide.

24. The radio frequency coil of claim 17, further comprising PIN diode circuitry located adjacent the first and third conductive rung sections.

25. The radio frequency coil of claim 24, wherein the magnetic resonance imaging apparatus has a field strength less than 1.0T.

26. The radio frequency coil of claim 1, wherein the thickness is a linear dimension measured in a substantially radial direction and the at least one conductive rung has a width measured in a substantially azimuthal direction.

* * * * *